United States Patent Office 3,512,971

Patented May 19, 1970

3,512,971

PRODUCTION OF PRINTING PLATES

Josef Georg Floss, Ludwigshafen (Rhine), Friedrich Bayerlein, Muenchen-Obermenzing, Rudolf Brodt, Weinheim/Bergstrasse, Herbert Henkler, Darmstadt, and Hugo Strehler, Hans Wilhelm, and Robert Gehm, Ludwigshafen (Rhine), Germany, assignors to Badische Anilin- & Soda-Fabrik Aktiengesellschaft, Ludwigshafen (Rhine), Germany No Drawing. Filed Aug. 29, 1967, Ser. No. 663,991
Claims priority, application Germany, Sept. 2, 1966, 1,522,469
Int. Cl. G03c *1/68*
U.S. Cl. 96—35.1 2 Claims

ABSTRACT OF THE DISCLOSURE

Production of printing plates by exposing plates or sheets made of mixtures of polyamides, m-xylylenebisacrylamide or m-xylene-bismethacrylamide and photoinitiators and/or polymerization inhibitors to light through a negative or positive and removing the unexposed areas.

This invention relates to a process for the production of printing plates by exposing plates or sheets made of a mixture of a synthetic linear polyamide, monomers having at least two polymerizable double bonds and photoinitiators and/or polymerization inhibitors to light through a negative or positive and removing the unexposed areas.

It is known that printing plates can be prepared by exposing plates or sheets of a mixture of a highly polymerized cellulose derivative with an unsaturated monomer which has more than one polymerizable double bond, and a photoinitiator to light through a negative or positive and then removing the unexposed areas with a suitable solvent down to the desired depth. These printing plates are suitable for letterpress printing and dry offset printing. Plates of this type, however, are not always sufficiently resistant to abrasion and cannot be manufactured reproducibly. Moreover, the plates are often too brittle for practical purposes.

It is also known that plates and sheets of linear saturated polyamides, monomers having at least two double bonds and photoinitiators can be used for the production of printing plates. If the monomers are used in an amount of 1 to 25% by weight with reference to the whole mixture, the plates obtained after exposure to light through a negative or positive followed by development, i.e. removal of the unexposed areas, with conventional solvents have a light sensitivity and an image sharpness which are not always satisfactory. If, in order to overcome these shortcomings, the monomers are added in higher concentrations, for example more than 25%, they do not dissolve completely in the polyamides, which results in cloudiness, exudation and inhomogeneities in the plates.

The compatibility of the polyamides with the monomers has therefore been improved by using polyamides which have first been methylolated followed by etherification of the methylol groups. When using such mixtures, there is a risk that undesired crosslinking may take place prematurely during the production of the plates and sheets. Moreover, the plates and sheets lack stability in storage.

In some cases the inadequate compatibility of the monomers with the polyamide can be improved by adding auxiliaries, e.g. plasticizers. These auxiliaries are, however, effective only when used in relatively large concentrations and unfavorably affect the mechanical properties of the finished printing plates.

We have now found that the production of printing plates by the exposing plates or sheets of mixtures of 80 to 50% by weight of a synthetic linear polyamide, 20 to 50% by weight of at least one monomer having at least two polymerizable double bonds, and a photoinitiator and/or polymerization inhibitor, to light through a negative or positive followed by removal of the unexposed areas, can be advantageously carried out by employing as the monomer, m-xylylene-bisacrylamide or m-xylylene-bismethacrylamide.

The monomers to be used according to this invention can be course be used in admixture with other monomers.

m-Xylylene-bisacrylamide or m-xylylene-bismethacrylamide may be incorporated into the polyamides to be used for the manufacture of printing plates in very large concentrations. They improve the compatibility of the polyamides with other monomers, thus enabling the monomer concentration in the total mixture to be increased. Increased monomer concentration results in improved light sensitivity of the plates and outstanding image sharpness of printing plates prepared therefrom. In creased light sensitivity permits the use of weaker light sources, which is often desired.

Preferred linear polyamides for the purposes of this invention are copolyamides which are soluble in the common solvents or mixtures of solvents, such as lower aliphatic alcohols or mixtures of alcohols and water, ketones, aromatics or mixtures of benzene, alcohol and water, for example copolyamides prepared by conventional methods by polycondensation or activated anionic polymerization of two or more lactams having five to thirteen ring members. Examples of these lactams are pyrrolidone, caprolactam, enantholactam, capryllactam, laurolactam or suitably C-substituted lactams, such as C-methyl-epsilon-caprolactam, epsilon-ethyl-epsilon-caprolactam or $\delta$-ethylenantholactam. The aminocarboxylic acids on which these lactams are based may be polycondensed instead of the lactams. Other suitable polyamides are polycondensation products of salts of the diamine-dicarboxylic acid type which have been prepared from at least three polyamide-forming starting materials. Examples of common and suitable dicarboxylic acids and diamines for this purpose are adipic acid, suberic acid, sebacic acid, dodecene dicarboxylic acid and equivalent substitution products, such as $\alpha,\alpha'$-diethyladipic acid, $\alpha$-ethylsuberic acid, $\alpha$-nonyl-$\alpha,\omega$-octane dicarboxylic acid, $\alpha$-octyl-$\alpha,\omega$-nonane dicarboxylic acid or mixtures of the same as well as dicarboxylic acids containing aliphatic or aromatic rings; diamines, such as pentamethylene diamine, hexamethylene diamine, heptamethylene diamine, octamethylene diamine or C-substituted and/or N-substituted derivatives of these amines, such as N-methylhexamethylene diamine, N-ethylhexamethylene diamine, 1,6-diamino-3-methylhexane, cycloaliphatic or aromatic diamines, such as m-phenylene diamine, m-xylylene diamine, and 4,4'-diaminodiphenylmethane, the bridging groups between the two carboxylic acid groups or amino groups being optionally interrupted by heteroatoms. Copolyamides which are particularly suitable are those which have been prepared by cocondensation of a mixture of one or more lactams and at least one salt of a dicarboxylic acid and a diamine, for example epsilon-caprolactam, hexamethylene diammonium adipate and p,p'-diaminodicyclohexylmethane adipate. Homopolymers and homopolycondensates, if desired in admixture with the said polyamide-forming starting materials, are also suitable provided they are soluble.

Suitable comonomers which may be used in admixture with the monomers according to this invention and likewise contains at least two polymerizable double bonds are for example those which contain in addition to double bonds amide groups, such as methylene-bis-acrylamide, methylene - bis - methacrylamide and the bis-acrylamides or bis-methacrylamides of ethylene diamine, propylene, diamine, butylene diamine, pentamethylene diamine, hexamethylene diamine, heptamethylene diamine, octamethylenediamine and of polyamides and other diamines whose chains may be branched or interrupted by heteroatoms. Monomers which contain urethane or urea groups as well as amide groups, such as the reaction products of diol monoacrylates and methacrylates with diisocyanates or the corresponding reaction products of the monoacrylamides of diamines with diisocyanates, are also very suitable. Other suitable monomers are diacrylates, triacrylates, tetraacrylates, dimethacrylates, trimethacrylates and tetramethacrylates or dihydric or higher polyhydric alcohols or phenols. The use of bifunctional or higher polyfunctional polymerizable monomers is however not limited to the above selection.

Examples of suitable photoinitiators are compounds which decompose into radicals under the action of light and which start the polymerization, for example vicinal ketaldonyl compounds, such as diacetyl, benzil and acyloins, such as benzoin; acyloin ethers, such as benzoinmethyl ether; α-substituted aromatic acyloins, such as α-methylbenzoin; azonitriles, such as 1,1 - azodicyclohexane carbonitrile; and substituted and unsubstituted polynuclear quinones, e.g. 9.10-anthraquinone, 1-chloroanthraquinone, 2-chloroanthraquinone, 2 - methylanthraquinone, 1,4-napthaquinone and 9,10-phenanthrenequinone. These initiators have the advantage of being thermally inactive at temperatures up to 85° C., sometimes even up to 170° C., undesired polymerization reactions during the manufacture and storage of the plates thus being avoided. The photoinitiators are used in amounts of 0.01 to 5% by weight, preferably 0.01 to 3% by weight, on the whole mixture.

It has been found to be advantageous in some cases to add to the mixtures 0.001 to 1, preferably 0.01 to 0.5, percent by weight, based on the whole mixture, of inhibitors which prevent thermal polymerization if the processing conditions include temperatures at which the monomers used tend to undergo thermal polymerization. Stability in storage may also be considerably improved in most cases by adding inhibitors. These inhibitors are often already present in the monomers used, e.g. hydroquinone, p-methoxy phenol, di-tert-butyl-p-cresol or phenothiazine.

The plates and sheets of the mixtures used in accordance with this invention may be prepared by conventional methods, for example by dissolving the components and removing the solvent followed by molding, extrusion or rolling of the finely divided mixture. The solutions of the components may also be cast into plates or sheets.

Low light sources of low ultraviolet intensity, such as fluorescent tubes emitting a high proportion of blue light, may be used as well as conventional high-energy lamps, such as carbon arms, xenon lamps, mercury vapor lamps, or fluorescent tubes.

Unexposed areas are washed out, for example by spraying, rubbing out or brushing out in the presence of solvents.

Printing plates having very good image sharpness are obtained with relatively short exposure times according to this invention. The high content of monomers in the mixtude of polyamide and monomers does not result in inhomogeneities. The process according to the invention is suitable for the production of printing plates for letterpress printing, intaglio printing and dry offset printing. If desired, the plates, sheets or films may be mounted on rigid or flexible bases of metal, wood, paper or plastics before or after exposure.

The invention is illustrated by the following examples in which parts are by weight.

EXAMPLE 1

100 parts of a soluble copolyamide (which has been prepared by polycondensation of 35 parts of hexamethylene diammonium adipate, 35 parts of the adipic acid salt of p,p'-diammoniumdicyclohexylmethane and 30 parts of epsilon-caprolactam), 32 parts of m-xylylene-bisacrylamide, 21 parts of hexamethylene-bis-acrylamide, 10 parts of triethylene glycol diacrylate, 3 parts of butanediol monoacrylate, 1 part of maleic anhydride, 1 part of benzoin methyl ether and 0.02 part of hydroquinone are dissolved in 500 parts of methanol. The clear viscous solution is poured into dishes to evaporate the solvent and placed in a current of air for twelve hours. The dry product is comminuted and dried for another twenty-fours hours in vacuo at 20° to 50° C. The dry material is then finely granulated and in one operation molded at 160° C. into a plate 1 mm. in thickness and pressed onto a metal base provided with an adhesive coating. The plate is exposed for five minutes in a vacuum copying frame through a combined half-tone/line negative. The source of light is a group of twenty fluorescent tubes (type Philips TLA 40 W/05) which are mounted closely side by side. The distance between the plate and the fluorescent tubes is 5 cm. The exposed plate is then sprayed for 10 minutes with an 80:20 mixture of propanol and water at 30° C. at a pressure of 3 atmospheres gauge in a wash-out machine and the unexposed areas are washed out down to the metal base. A relief printing plate with a raised image and a relief depth of 1 mm. is obtained which faithfully reproduces every detail of the negative used. It can be immediately used as a letterpress printing plate.

EXAMPLE 2

A solution of 100 parts of the polyamide described in Example 1, 65 parts of m-xylylene-bisacrylamide, 15 parts of triethylene glycol diacrylate, 1 part of benzoin methyl ether and 0.01 part of p-methoxyphenol in 400 parts of methanol is processed into a light-sensitive plate as described in Example 1. The plate is exposed as described above through a combined half-tone/line negative for five minutes and the unexposed areas are washed out. The printing plate obtained exhibits very good image sharpness and reproduces every detail of the negative used. The relief has sloping shoulders and the individual dots are not affected by lateral pressure. The depth washed out is 1 mm. after 11 minutes.

EXAMPLE 3

A solution of 100 parts of the polyamide described in Example 1, 50 parts of m-xylylene-bisacrylamide, 10 parts of triethylene glycol diacrylate, 10 parts of butanediol monoacrylate, 1 part of maleic anhydride, 1 part of benzoin methyl ether and 0.1 part of p-tert-butyl-cresol is processed into a 1 mm. light-sensitive plate as described in Example 1. The plate is exposed and washed out as described.

We claim:

1. In a process for the production of printing plates by exposing plates or sheets of mixtures of 80 to 50% by weight of synthetic linear polyamide, 20 to 50% by weight of at least one monomer having at least two polymerizable double bonds, and photoinitiators and/or polymerization inhibitors to light through a negative or positive and removing the unexposed areas, the improvement which comprises using the monomer, m-xylylene-bisacrylamide or m-xylylene-bismethacrylamide.

2. A process as claimed in claim 1 wherein m-xylylene-bisacrylamide or m-xylylene-bimethacrylamide is used in admixture with other monomers having at least two polymerizable double bonds.

References Cited

UNITED STATES PATENTS

| | | | |
|---|---|---|---|
| 2,972,540 | 2/1961 | Saner et al. | 96—115 |
| 2,997,391 | 8/1961 | Murray et al. | 96—115 XR |
| 3,081,168 | 3/1963 | Leekley et al. | 96—35.1 |
| 3,375,110 | 3/1968 | Loeb | 96—115 XR |
| 3,395,016 | 7/1968 | Loeb | 96—115 XR |

RONALD H. SMITH, Primary Examiner

U.S. Cl. X.R.

96—115

PO-1050
(5/69)

UNITED STATES PATENT OFFICE
CERTIFICATE OF CORRECTION

Patent No. 3,512,971 Dated May 19, 1970

Inventor(s) Josef Georg Floss et al

It is certified that error appears in the above-identified patent and that said Letters Patent are hereby corrected as shown below:

Column 3, line 17, "polyamides" should read -- polyamines --; line 38, "9.10-anthraquinone" should read -- 9,10-anthraquinone --.

SIGNED AND SEALED

SEP 1 - 1970

(SEAL)
Attest:

Edward M. Fletcher, Jr.
Attesting Officer

WILLIAM E. SCHUYLER, JR.
Commissioner of Patents